(12) United States Patent
Lee et al.

(10) Patent No.: US 7,864,089 B2
(45) Date of Patent: Jan. 4, 2011

(54) FAST FOURIER TRANSFORMATION-BASED ANALOG-TO-DIGITAL CONVERTER CALIBRATION SYSTEM

(75) Inventors: Shuenn-Yuh Lee, Minxiong Shiang (TW); Ming-Chun Liang, Pingtung (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 12/574,772

(22) Filed: Oct. 7, 2009

(65) Prior Publication Data

US 2010/0103007 A1    Apr. 29, 2010

(30) Foreign Application Priority Data

Oct. 24, 2008    (TW) .............................. 97140976 A

(51) Int. Cl.
*H03M 1/06* (2006.01)

(52) U.S. Cl. ..................... 341/118; 341/117; 341/120; 341/119; 341/155

(58) Field of Classification Search ......... 341/117–120, 341/155, 156, 161
See application file for complete search history.

(56) References Cited

U.S. PATENT DOCUMENTS 7,289,053 B2 * 10/2007 Bunin ..................... 341/156
7,355,536 B2 *  4/2008 Dempsey et al. ........... 341/120

* cited by examiner

*Primary Examiner*—Jean B Jeanglaude
(74) *Attorney, Agent, or Firm*—Ming Chow; Sinorica, LLC

(57) ABSTRACT

The present invention discloses an FFT-based ADC calibration system able to solve the problems of capacitor mismatch and finite Op-Amp open loop gain, which result in that the radix of the gain of each stage is not exactly equal to 2. The present invention uses an FFT processor to calculate the real radix of each stage and uses a digital method to generate new digital outputs. As the present invention can compensate the finite gain of Op-Amp, the specification of Op-Amp is not so critical in designing ADC. Therefore, the low-gain Op-Amp can be used to reduce the power consumption of ADC. Further, the FFT-based calibration technology can considerably promote the performance of ADC.

9 Claims, 4 Drawing Sheets

FAST FOURIER TRANSFORMATION-BASED ANALOG-TO-DIGITAL CONVERTER CALIBRATION SYSTEM

BACKGROUND OF THE INVENTION

1. Field of the Invention

The present invention relates to a calibration technology for a pipeline ADC, particularly to an FFT-based ADC calibration system.

2. Description of the Related Art

Recently, many communication systems need ADC (Analog-to-Digital Converter) to bridge the analog signal and DSP (Digital Signal Processor), especially the high-resolution and high-sample rate ADC facilitating the fast development of communication systems, and the pipeline ADC is a frequently used architecture among them.

The performance of the conventional ADC is affected by capacitor mismatch, finite Op-Amp (Operation Amplifier) open loop gain, and comparator offset. Therefore, calibration systems are used to achieve a high-resolution ADC, and the digital calibration system is a frequently-used one among them. The digital calibration system performs additional coding on the digital output.

The present invention uses an FFT processor to calculate the errors of all the stages of the pipeline ADC and performs coding calibration in the digital output terminal to promote ADC performance.

SUMMARY OF THE INVENTION

One objective of the present invention is to provide a calibration system for a pipeline ADC to overcome the abovementioned problems.

To achieve the abovementioned objective, the present invention proposes an FFT-based ADC calibration system. In one embodiment, the FFT-based ADC calibration system comprises a pipeline ADC, an FFT processor, and a digital control system.

More and more OFDM (Orthogonal Frequency Division Multiplexing) systems are used now, and the OFDM system itself contains an FFT processor. Therefore, the FFT processor of the OFDM system can be directly used in ADC calibration.

The FFT-based ADC calibration system is a digital calibration technology and uses an FFT processor to perform a fast Fourier transformation on the output of ADC and calculate the errors of ADC. Then, the FFT-based ADC calibration system recodes the output of ADC, and the recoded digital data is the final digital output.

DETAILED DESCRIPTION OF THE INVENTION

Figure 2:
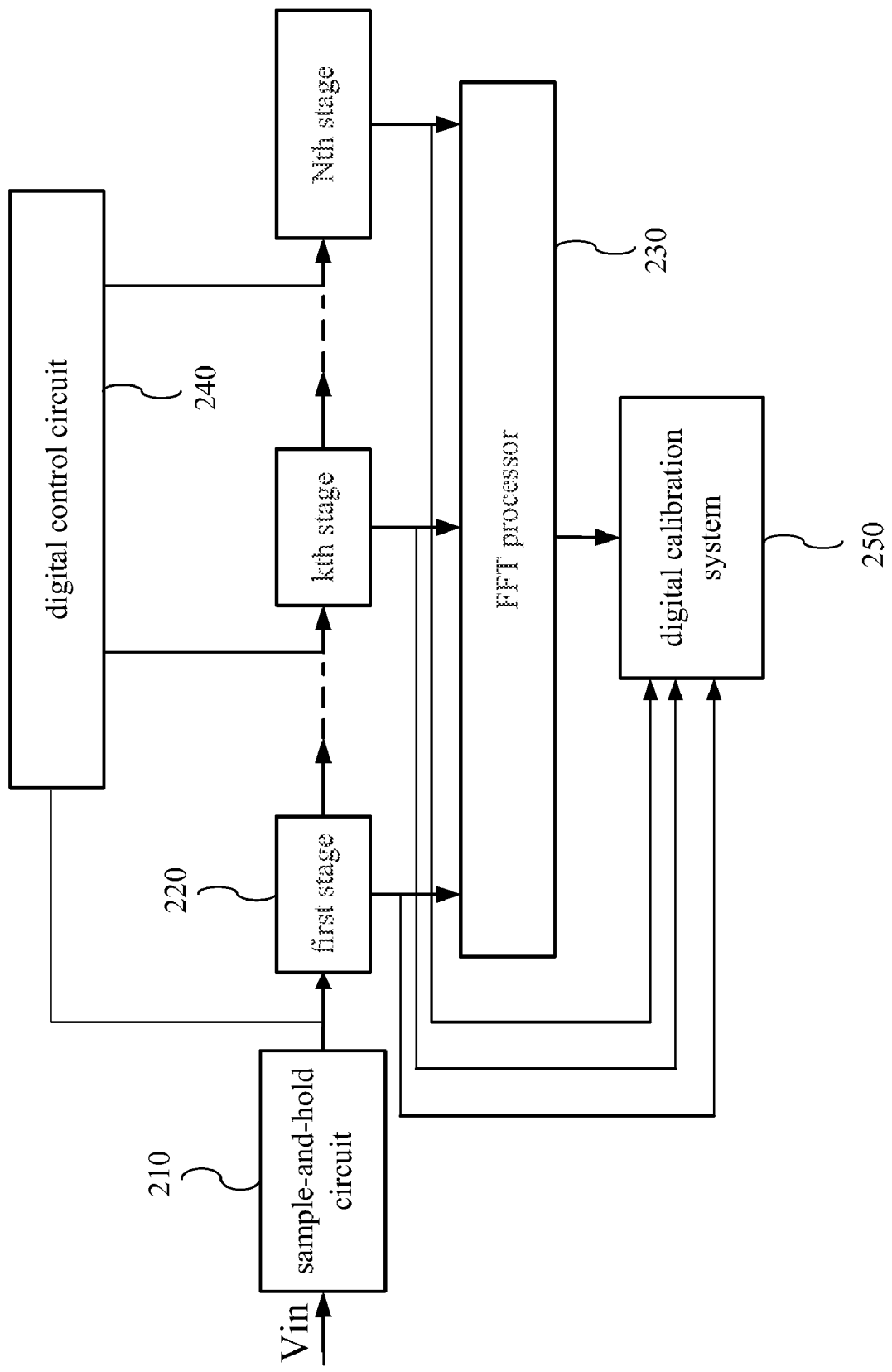
FIG. 2 is a block diagram schematically showing the architecture of an FFT-based pipeline ADC calibration system according to one embodiment of the present invention.

Refer to FIG. 2 a diagram schematically showing the architecture of an FFT-based calibration system 200 for a pipeline ADC according to one embodiment of the present invention. The FFT-based calibration system 200 comprises a pipeline structure, an FFT processor 230 and a digital control circuit 240. The pipeline structure further comprises a sample-and-hold circuit 210 and several stages 220 cascaded in sequence. In this embodiment, the pipeline ADC is exemplified with a 1.5 bit/stage architecture.

Figure 4:
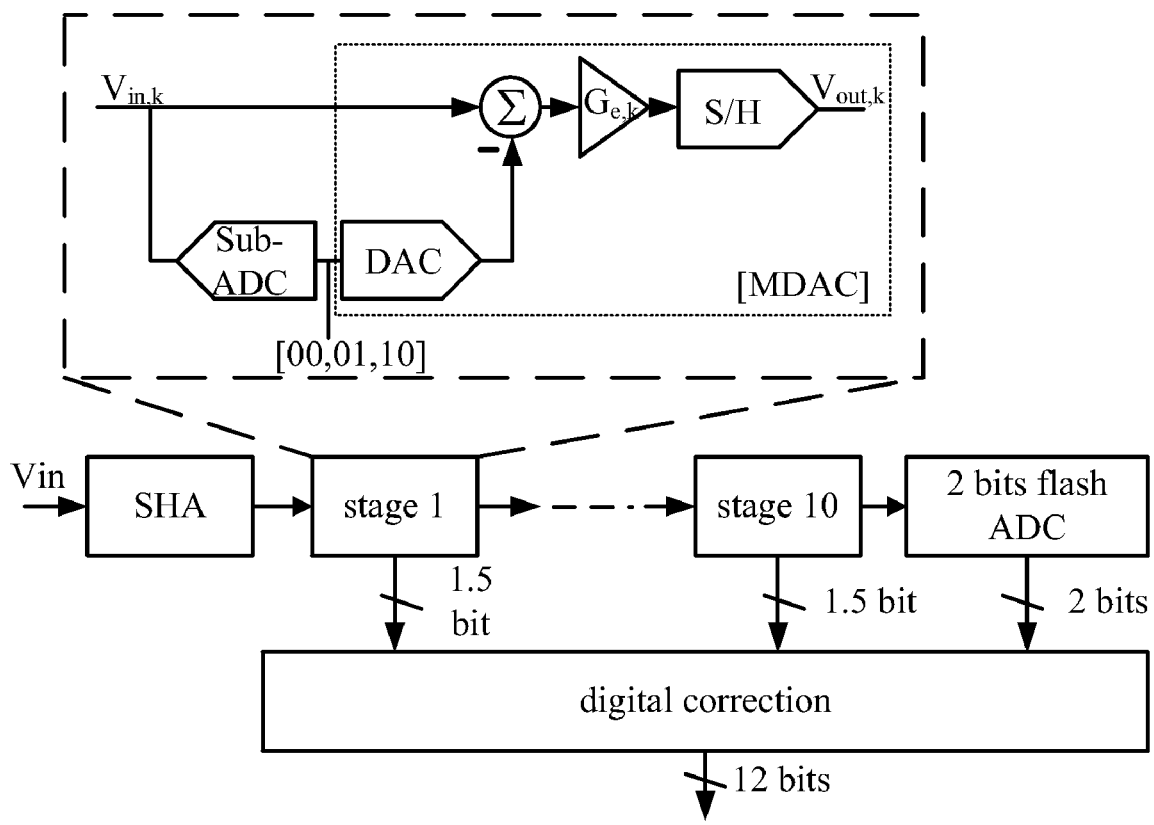
FIG. 4 is a block diagram schematically showing a multi-bit ADC.
Figure 4:
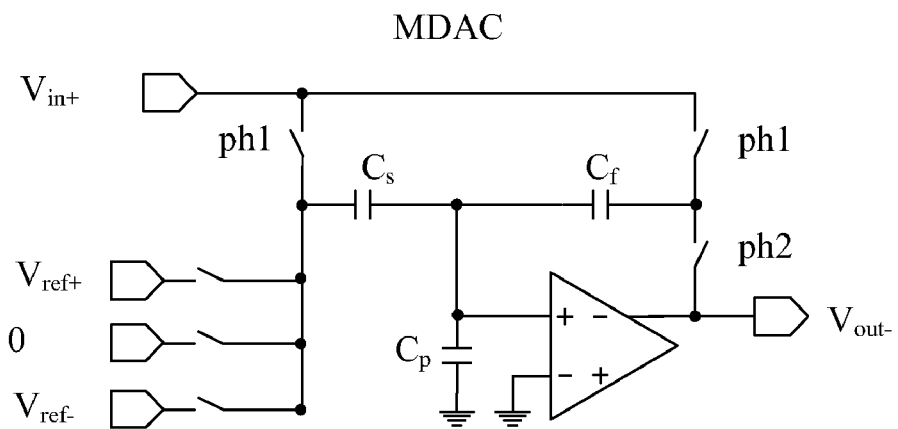

Suppose $V_{in,k}$ is the input of the kth stage and $V_{out,k}$ is the output of the kth stage. For the 1.5 bit/stage architecture, $$V_{out,k} = 2(V_{in,k} + \alpha V_{ref}/2) \quad (1)$$

wherein $\alpha$ is $-1$, 0, or 1. When $V_{in,k} > V_{ref}/4$, $\alpha = -1$. When $V_{ref}/4 > V_{in,k} > -V_{ref}/4$, $\alpha = 0$. When $-V_{ref}/4 > V_{in,k}$, $\alpha = 1$. A charge redistribution method is usually used to achieve a gain of 2. Refer to FIG. 4, wherein one stage is exemplified with MDAC (Multiplying Digital-to-Analog Converter). The transfer function of MDAC is expressed by $$V_{out,k} = V_{in,k} \frac{C_S + C_f}{\left(1 + \frac{1}{A_{vo}}\right)C_f + \frac{C_S}{A_{vo}} + \frac{C_P}{A_{vo}}} + \alpha \frac{C_S}{\left(1 + \frac{1}{A_{vo}}\right)C_f + \frac{C_S}{A_{vo}} + \frac{C_P}{A_{vo}}} V_{ref} \quad (2)$$

wherein $C_s$ is the sampling capacitance, $C_f$ is the feedback capacitance, $C_p$ is the input parasitic capacitance of Op-Amp (Operation Amplifier), and $A_{vo}$ is the Op-Amp open loop gain. According to Equation (2), $V_{out,k} = 2(V_{in,k} + \alpha V_{ref}/2)$ if $A_{vo}$ is infinite and $C_s = C_f$. Owing to process variation, the sampling capacitor may not match the feedback capacitor, and the Op-Amp open loop gain is unlikely to be infinite. Therefore, the radix of gain is not necessarily equal to 2. Considering capacitor mismatch and finite Op-Amp open loop gain, Equation (2) should be revised into $$V_{out,k} = V_{in,k} \frac{C_S + \Delta C_S + C_f + \Delta C_f}{\left(1 + \frac{1}{A_{vo}}\right)(C_f + \Delta C_f) + \frac{C_S + \Delta C_S}{A_{vo}} + \frac{C_P}{A_{vo}}} + \alpha \frac{C_S + \Delta C_S}{\left(1 + \frac{1}{A_{vo}}\right)(C_f + \Delta C_f) + \frac{C_S + \Delta C_S}{A_{vo}} + \frac{C_P}{A_{vo}}} V_{ref} \quad (3)$$

wherein $\Delta C_s$ and $\Delta C_f$ are process variation-induced errors of the sampling capacitor and the feedback capacitor. From Equation (2), it is known: if the capacitors mismatch and the Op-Amp open loop gain is finite, the radix of the gain is not equal to 2, and $$V_{out,k} = (2 + \Delta g_1)(V_{in,k} + \alpha V_{ref}/2) \quad (4)$$

wherein $\Delta g_1$ is the Op-Amp's error caused by capacitor mismatch and finite Op-Amp open loop gain. Comparing Equation (4) with Equation (1), it is known: $\Delta g_i(V_{in,k} + \alpha V_{ref}/2)$ is the difference between the ideal radix and the real radix caused by capacitor mismatch and finite Op-Amp open loop gain.

Suppose the stages of the pipeline ADC have been calibrated except the first stage, and suppose the input signal $V_{in} = A\cos(\omega t)$, $V_{ref} = A$, and the error $e(t) = \Delta g_1(V_{in} + \alpha V_{ref}/2)$.

Below, the present invention performs a Fourier transformation on e(t) to find the coefficient of the third order harmonic.

(1) When $-V_{ref}/4 > V_{in,k}$, $\alpha=1$, and $e(t)=\alpha g_1(A\cos(\omega t)+A/2)$, and the coefficients of the nth-order harmonic is expressed by $$a_n = \int_{\cos^{-1}(-1/4)/\omega}^{\pi/\omega} [A\Delta g1\cos(\omega t) + A\Delta g1/2]\cos n(\omega t)\,dt \quad (5)$$

$$= \frac{-A(\Delta g_1)}{2}\left[\frac{\sin(n+1)(\cos^{-1}(-1/4))}{(n+1)\omega} + \frac{\sin(n-1)(\cos^{-1}(-1/4))}{(n-1)\omega}\right] - \frac{A\Delta g1\sin(\cos^{-1}(-1/4))}{2n\omega}$$

(2) When $V_{ref}/4 > V_{in,k} > -V_{ref}/4$, $\alpha=0$, and $e(t)=\Delta g_1(A\cos(\omega t))$, and the coefficients of the nth-order harmonic is expressed by $$a_n = \int_{\cos^{-1}(1/4)/\omega}^{\cos^{-1}(-1/4)/\omega} [A\Delta g1\cos(\omega t)]\cos n(\omega t)\,dt \quad (6)$$

$$= \frac{A(\Delta g_1)}{2}\left[\frac{\sin(n+1)(\cos^{-1}(-1/4))}{(n+1)\omega} + \frac{\sin(n-1)(\cos^{-1}(-1/4))}{(n-1)\omega} - \frac{\sin(n+1)(\cos^{-1}(1/4))}{(n+1)\omega} - \frac{\sin(n-1)(\cos^{-1}(1/4))}{(n-1)\omega}\right]$$

(3) When $V_{in,k} > V_{ref}/4$, $\alpha=-1$, and $e(t)=\Delta g_1(A\cos(\omega t)-A/2)$, and the coefficients of the nth-order harmonic is expressed by $$a_n = \int_0^{\cos^{-1}(1/4)/\omega} [A\Delta g1\cos(\omega t) - A\Delta g1/2]\cos n(\omega t)\,dt \quad (7)$$

$$= \frac{-A(\Delta g_1)}{2}\left[\frac{\sin(n+1)(\cos^{-1}(1/4))}{(n+1)\omega} + \frac{\sin(n-1)(\cos^{-1}(1/4))}{(n-1)\omega}\right] - \frac{A\Delta g1\sin(\cos^{-1}(1/4))}{2n\omega}$$

As the output is symmetric, it is sufficient to only concern the range $\pi/\omega > t > 0$. Via adding up Equations (5), (6) and (7) and dividing the sum with $\pi/2\omega$, the coefficients of the nth-order harmonic is revised into $$\frac{-A\Delta g_1}{n\pi}(\sin(n\cos^{-1}(-1/4)) + \sin(n\cos^{-1}(1/4))) \quad (8)$$

Thus, the coefficient of third order harmonic is $$0.154 \times \Delta g_1 \times A \quad (9)$$

In the 1.5 bit/stage pipeline ADC, the offset of the comparator has only a minor influence on the performance. Therefore, the offset of the comparator is neglected in the above deduction.

Figure 1:
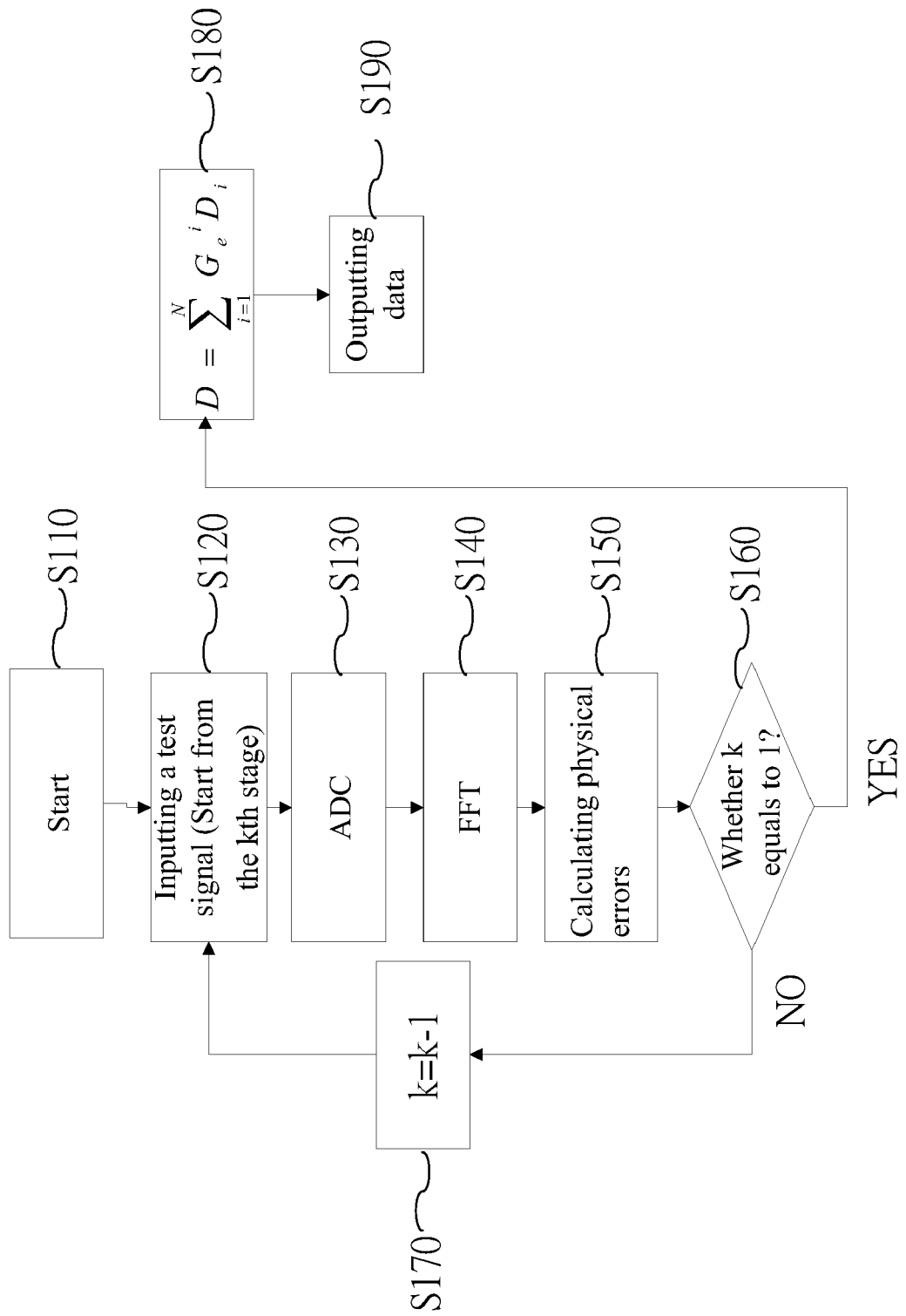
FIG. 1 is a flowchart of the operation of an FFT-based ADC calibration system according to one embodiment of the present invention.

Refer to FIG. 1 a flowchart of the operation of an FFT-based pipeline ADC calibration system according to one embodiment of the present invention. The flowchart 100 contains nine steps: start (Step 110), signal test (Step 120), pipeline ADC (Step 130), FFT processor (Step 140), calculating physical errors (Step 150), determining whether all the succeeding stages have been calibrated (Step 160), finding out the uncalibrated stages (Step 170), calculating the physical digital output (Step 180), and outputting data (Step 190).

In Step 120, an input test signal is a sinusoidal signal with an amplitude of A and a frequency of $2\pi f$. Generally, a sinusoidal wave with a lower frequency and an amplitude exactly equal to $V_{ref}$ will be adopted as the test signal. Also, how many stages need calibrating are determined in this step.

In Step 130, the pipeline ADC receives the input sinusoidal wave and converts the analog sinusoidal signal into a digital signal.

In Step 140, the FFT processor receives the digital signal output by the pipeline ADC and performs a fast Fourier transformation on the digital signal to work out the third order harmonic.

In Step 150, the third order harmonic obtained in Step 140 is used to calculate the error $\Delta g_k$ of the kth stage with Equation (9), and the error is stored in the register.

In Step 160, the system checks whether the error of the first stage has been obtained. If the error of the first stage has not been obtained yet, continue to calculate the error of the (k−1)th stage until the error of the first order is obtained.

In Step 170, if the error of the first stage has been obtained in Step 160, the analog signal, which is to be converted into a digital signal, is input, and the digital output is calibrated. In Step 150, the errors of all the stages have been worked out, and the real radix of each stage can also be worked out thereby. Then, the following equation can be used to calculate the final digital output.

$$D = \sum_{i=1}^{N} G_e^i d_i \quad (10)$$

wherein D is the final digital output, N is the ordinal number of the stage in the pipeline ADC, $G_e^i$ is the real radix of the ith stage, and $d_i$ is the digital signal generated by the ith stage.

Figure 3:
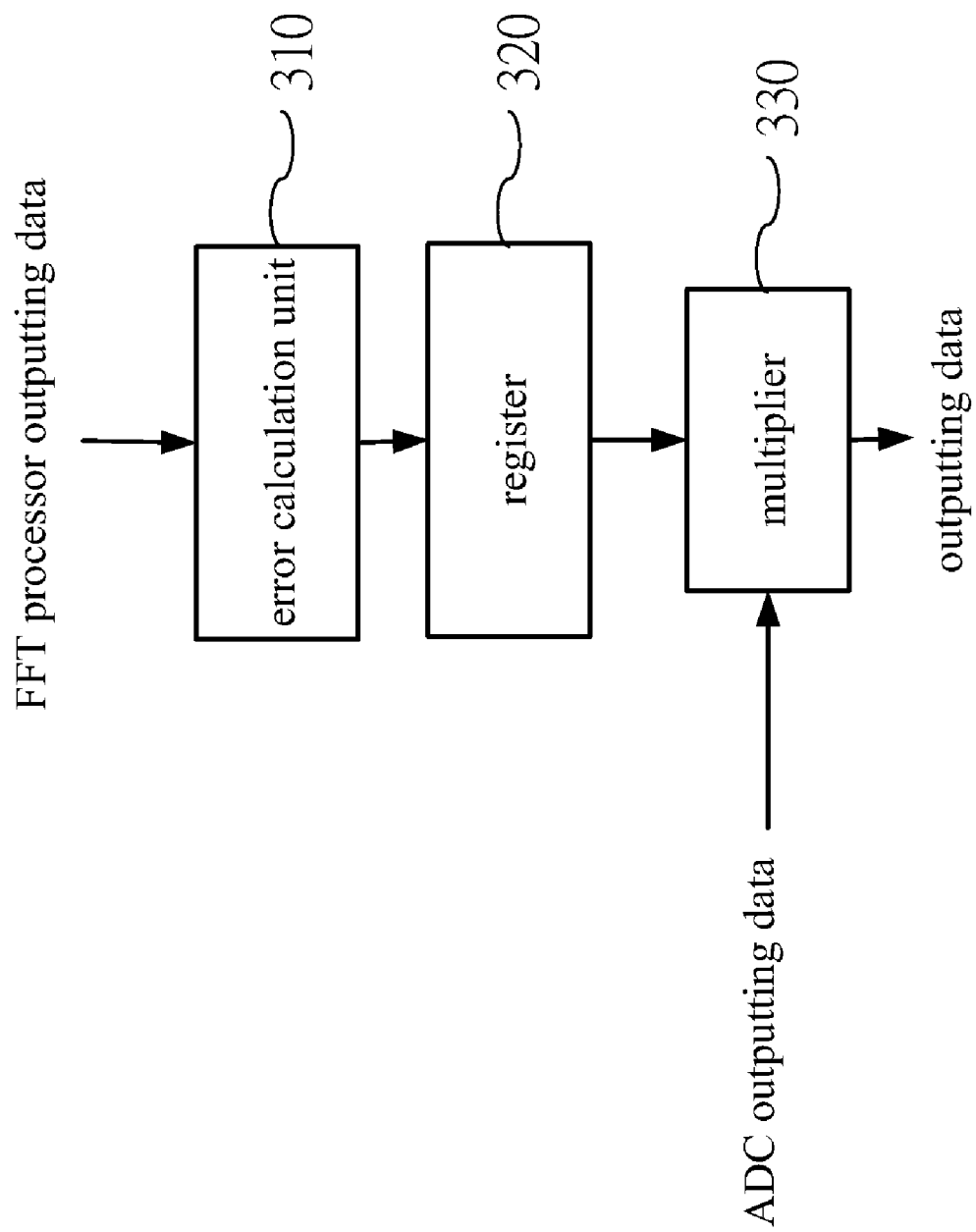
FIG. 3 is a block diagram schematically showing a digital calibration circuit of an FFT-based ADC calibration system according to one embodiment of the present invention.

Refer to FIG. 3 a diagram schematically showing a digital calibration circuit 300. The digital calibration circuit 300 includes an error calculation unit 310, a register 320 and a multiplier 330. The digital calibration circuit 300 performs digital calibration. The error calculation unit 310 calculates the errors according to Equation (9) and stores the errors in the register 320. Then, the multiplier 330 realizes Equation (10) and outputs the data.

From the above description, it is known the present invention has the following advantages:

(1) The present invention uses an FFT processor to calibrate the pipeline ADC, whereby the pipeline ADC is less sensitive to process variation.

(2) The present invention can also calibrate the Op-Amp open loop gain, whereby a low-gain Op-Amp can be used to reduce the power consumption of ADC.

The embodiments described above are only to exemplify the present invention but not to limit the scope of the present invention. Any equivalent modification or variation according to the spirit of the present invention is to be also included within the scope of the present invention, which is based on the claims stated below.

What is claimed is:

1. A Fast Fourier Transformation-based analog-to-digital converter calibration system at least comprising
   a pipeline analog-to-digital converter including a sample-and-hold circuit and a plurality of stages cascaded in sequence;
   a digital control system including a multiplexer selecting succeeding said stages whose errors are to be calculated;
   a Fast-Fourier-Transformation processor coupled to an output terminal of said pipeline analog-to-digital converter; and
   a digital calibration system, coupled to said Fast-Fourier-Transformation processor and said pipeline analog-to-digital converter, calculating errors and outputting data, wherein an input test signal is a sinusoidal signal with an amplitude of A and a frequency of $2\pi f$.

2. The Fast Fourier Transformation-based analog-to-digital converter calibration system according to claim 1, wherein a reference voltage of said pipeline analog-to-digital converter has a value of A, which is equal to amplitude of said input test signal.

3. The Fast Fourier Transformation-based analog-to-digital converter calibration system according to claim 1, wherein said multiplexer of said digital control system decreases a number of selected said stages by a decrement of 1 each time.

4. The Fast Fourier Transformation-based analog-to-digital converter calibration system according to claim 1, wherein said Fast-Fourier-Transformation processor and said digital calibration system are used to calculate errors and output digital signals.

5. The Fast Fourier Transformation-based analog-to-digital converter calibration system according to claim 3, wherein said digital calibration system further comprises an error calculation unit and a register.

6. The Fast Fourier Transformation-based analog-to-digital converter calibration system according to claim 5, wherein said error calculation unit uses a coefficient of a third order harmonic worked out by said Fast-Fourier-Transformation processor to calculate an error.

7. The Fast Fourier Transformation-based analog-to-digital converter calibration system according to claim 6, wherein said error is about equal to said coefficient of said third order harmonic$\div 0.154 \div A$.

8. The Fast Fourier Transformation-based analog-to-digital converter calibration system according to claim 5, wherein said register stores errors.

9. The Fast Fourier Transformation-based analog-to-digital converter calibration system according to claim 5, wherein in addition to calculating errors, said error calculation unit performs recoding and outputs new digital signals.

* * * * *